US005194684A

United States Patent [19]

Lisle et al.

[11] Patent Number: 5,194,684

[45] Date of Patent: Mar. 16, 1993

[54] METHOD AND APPARATUS FOR SELECTIVE REDUCTION OF UPPER HARMONIC CONTENT IN DIGITAL SYNTHESIZER EXCITATION SIGNALS

[75] Inventors: Ronald J. Lisle, Cedar Park; B. Scott McDonald, Leander, both of Tex.

[73] Assignee: International Business Machines Corporation, Armonk, N.Y.

[21] Appl. No.: 608,105

[22] Filed: Nov. 1, 1990

[51] Int. Cl.[5] .......... G10H 7/00; H03K 4/08

[52] U.S. Cl. .......... 84/659; 84/672; 84/692; 84/696; 84/698; 307/261

[58] Field of Search .......... 84/601, 671, 659, 607, 84/604, 660, 661, 696, 698, 622, 645, 648, 6, 675, 622, 697, DIG. 9, 672, 673, 692; 328/13, 14, 15, 16, 22, 23, 34-36, 181; 307/228, 261

[56] References Cited

U.S. PATENT DOCUMENTS

| | | | |
|---|---|---|---|
| Re. 31,648 | 8/1984 | Kondo et al. | 84/604 |
| 4,283,637 | 8/1981 | Handte et al. | 307/261 |
| 4,348,932 | 9/1982 | Kashio | 84/622 |
| 4,440,058 | 4/1984 | Bass et al. | 84/607 |
| 4,479,411 | 10/1984 | Ishibashi | 84/604 |
| 4,614,144 | 9/1986 | Sagara et al. | 84/604 |
| 4,622,877 | 11/1986 | Strong | 84/622 |
| 4,649,783 | 3/1987 | Strong et al. | 84/606 |
| 4,677,890 | 7/1987 | Yannes | 84/DIG. 9 |
| 4,974,486 | 12/1990 | Wallace | 84/601 |

*Primary Examiner*—William M. Shoop, Jr.
*Assistant Examiner*—H. Kim
*Attorney, Agent, or Firm*—Andrew J. Dillon

[57] ABSTRACT

Variable frequency sawtooth waveforms are often utilized as an excitation signal in a digital musical synthesizer. A problem exists at lower sampling rates in such systems due to an aliasing problem which occurs at frequencies near the Nyquist rate. Low pass filtering may be utilized to mask this problem; however, low pass filtering is very time consuming to implement in a ditigal signal processor. The method and apparatus of the present invention reduces the upper harmonic content of a sawtooth waveform by proportionally converting the sawtooth waveform to a triangle waveform in response to variations in the frequency of the sawtooth waveform. This is accomplished by adding a selectable offset to the sawtooth waveform and then taking the absolute value of the resultant waveform. By restoring this waveform to a zero offset, the sawtooth waveform excitation signal will be converted to a triangle waveform having a substantially reduced upper harmonic content. By varying the selectable offset in response to variations in the frequency of the sawtooth waveform, it is possible to efficiently vary the amount of conversion which occurs.

12 Claims, 3 Drawing Sheets

METHOD AND APPARATUS FOR SELECTIVE REDUCTION OF UPPER HARMONIC CONTENT IN DIGITAL SYNTHESIZER EXCITATION SIGNALS

BACKGROUND OF THE INVENTION

1. Technical Field

The present invention relates in general to the field of digital music synthesizers and in particular to a method and apparatus for selectively reducing the upper harmonic content of digital synthesizer excitation signals. Still more particularly, the present invention relates to a method and apparatus for selectively converting a sawtooth waveform to a triangle waveform in response to an increase in the frequency of the sawtooth waveform.

2. Description of the Related Art

Musical synthesizers have been well known in the prior art for some time. Early analog synthesizers typically utilized an excitation waveform generator capable of generating a sawtooth waveform, a triangle waveform and a square wave. The output frequency of the excitation waveform generator was controllable in response to the desired pitch and often a low frequency oscillator was connected to the excitation waveform generator to permit vibrato effects to be generated.

In such systems, the selectable output of the excitation waveform generator was then typically coupled to a filter and amplifier before being connected to an audio output device, such as a speaker.

Early researchers in the music synthesizer area discovered that the control of a suitable filter and voltage controlled amplifier may be expeditiously accomplished by means of a so-called Attack-Decay-Sustain-Release (ADSR) circuit. By selectively controlling the output of the ADSR circuit in each of its four segments, the excitation signal may be shaped and filtered to approximate the sound of the desired musical instrument.

In digital music synthesizer systems which utilize subtractive synthesis, a sawtooth waveform is typically utilized as the excitation signal. This is preferred due to the fact that a sawtooth waveform may be simply and easily generated in a digital system by the initiation of a signal, the incrementing of that signal by a constant value and the storing of the new value. This technique typically requires only three processor steps to accomplish. Additionally, a sawtooth waveform is an excellent selection for an excitation signal due to the rich harmonic nature of such waveforms.

One problem which exists with the utilization of a sawtooth waveform as an excitation signal for a digital music synthesizer occurs as a result of the rich high harmonic content of a sawtooth waveform. An aliasing problem, as will be described in greater detail below, creates a problem when attempting to synthesize high frequency sounds. Higher sampling rates may minimize the effect of this aliasing; however, in any attempt to implement a digital synthesizer utilizing a single digital signal processor a limited number of process steps are available for each note. Thus, the sample rate utilized in such systems is generally on the order of twenty to fifty thousand samples per second.

As those skilled in the digital signal processing art will appreciate, with a sampling rate of 20,000 samples per second the maximum frequency present in the resultant system is 10,000 cycles per second, as a result of the rule stated in the Nyquist Theorem.

As a result, as higher frequencies are synthesized utilizing a digital sample data system with a low sampling rate an aliasing problem will occur at those higher frequencies as the Nyquist frequency is approached due to a "folding over" which occurs at those frequencies. This aliasing problem may be masked by the utilization of a low pass filter to remove the upper harmonic content of the sawtooth waveform excitation signal; however, this approach cannot cure the aliasing problem and low pass filters are difficult to implement in a digital system and require a substantial amount of the available processor assets.

Thus, it should be apparent that a need exists for a method and apparatus whereby the upper harmonic content of a sawtooth waveform excitation signal may be minimized without requiring the utilization of extensive processor assets.

SUMMARY OF THE INVENTION

It is therefore one object of the present invention to provide an improved digital music synthesizer.

It is another object of the present invention to provide an improved method and apparatus for selectively reducing the upper harmonic content of digital synthesizer excitation signals.

It is yet another object of the present invention to provide an improved method and apparatus for selectively converting a sawtooth excitation waveform to a triangle waveform in response to an increase in the frequency of the sawtooth excitation waveform.

The foregoing objects are achieved as is now described. Variable frequency sawtooth waveforms are often utilized as an excitation signal in a digital musical synthesizer. A problem exists at lower sampling rates in such systems due to an aliasing problem which occurs at frequencies near the Nyquist rate. Low pass filtering may be utilized to mask this problem; however, low pass filtering is very time consuming to implement in a digital signal processor. The method and apparatus of the present invention reduces the upper harmonic content of a sawtooth waveform by proportionally converting the sawtooth waveform to a triangle waveform in response to variations in the frequency of the sawtooth waveform. This is accomplished by adding a selectable offset to the sawtooth waveform and then taking the absolute value of the resultant waveform. By restoring this waveform to a zero offset, the sawtooth waveform excitation signal will be converted to a triangle waveform having a substantially reduced upper harmonic content. By varying the selectable offset in response to variations in the frequency of the sawtooth waveform, it is possible to efficiently vary the amount of conversion which occurs.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
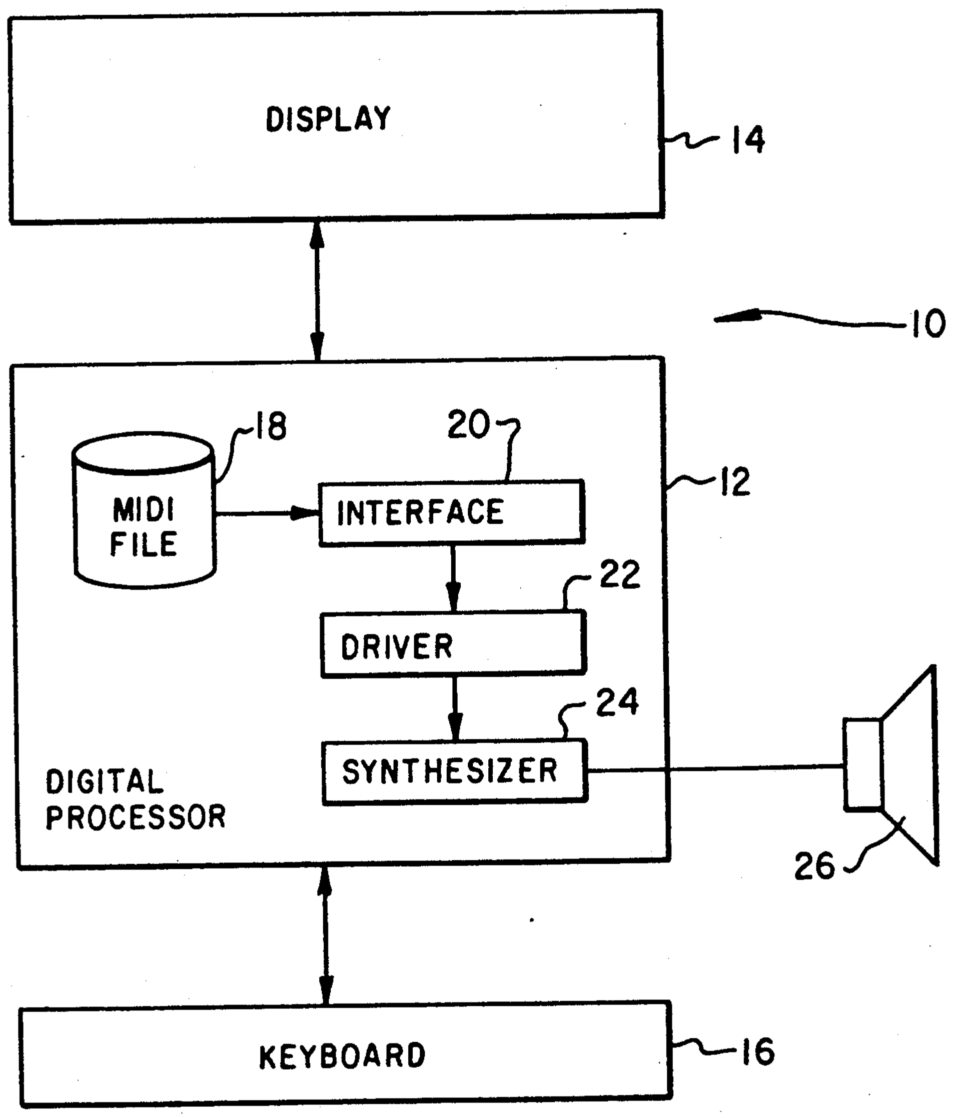
FIG. 1 is a block diagram depicting a computer system which may be utilized to implement a musical synthesizer in accordance with the method and apparatus of the present invention.

With reference now to the figures and in particular with reference to FIG. 1, there is depicted a block diagram which illustrates a computer system which may be utilized to implement a musical synthesizer in accordance with the method and apparatus of the present invention. As is illustrated, a computer system 10 is depicted. Computer system 10 may be implemented utilizing any state-of-the-art digital computer system having a suitable digital signal processor disposed therein which is capable of implementing a MIDI synthesizer. For example, computer system 10 may be implemented utilizing an IBM PS/2 type computer which includes an IBM Audio Capture & Playback Adapter (ACPA).

Also included within computer system 10 is a display 14. Display 14 may be utilized, as will be illustrated in greater detail herein, to display audio editor capabilities or other features of a music synthesizer. Also coupled to computer system 10 is a computer keyboard 16.

Referring now to digital processor 12, the implementation of a MIDI synthesizer utilizing a digital signal processor within a computer system is illustrated. As depicted, data contained within a MIDI file 18 is coupled to an interface 20. Interface 20 is preferably implemented utilizing any suitable audio application programming interface which permits the accessing of MIDI protocol files and the coupling of those files to an appropriate device driver. Device driver 22 is also preferably implemented in software and serves to process the MIDI file data in a manner which permits that data to be utilized to create synthesized music. Thereafter, the output of driver 22 is coupled to synthesizer 24. Synthesizer 24 is preferably a subtractive synthesizer which is implemented utilizing a suitable digital signal processor such as the digital signal processor which is contained within the IBM Audio Capture & Playback Adapter (ACPA). Thereafter, the output of synthesizer 24 may be coupled to an audio output device, such as speaker 26.

Thus, in the manner illustrated in FIG. 1, a modern digital computer may be utilized to emulate a MIDI synthesizer by utilizing a special purpose digital signal processor to access MIDI files stored within memory within the computer and to create or recreate musical compositions which have been stored as digital MIDI files.

Figure 2:
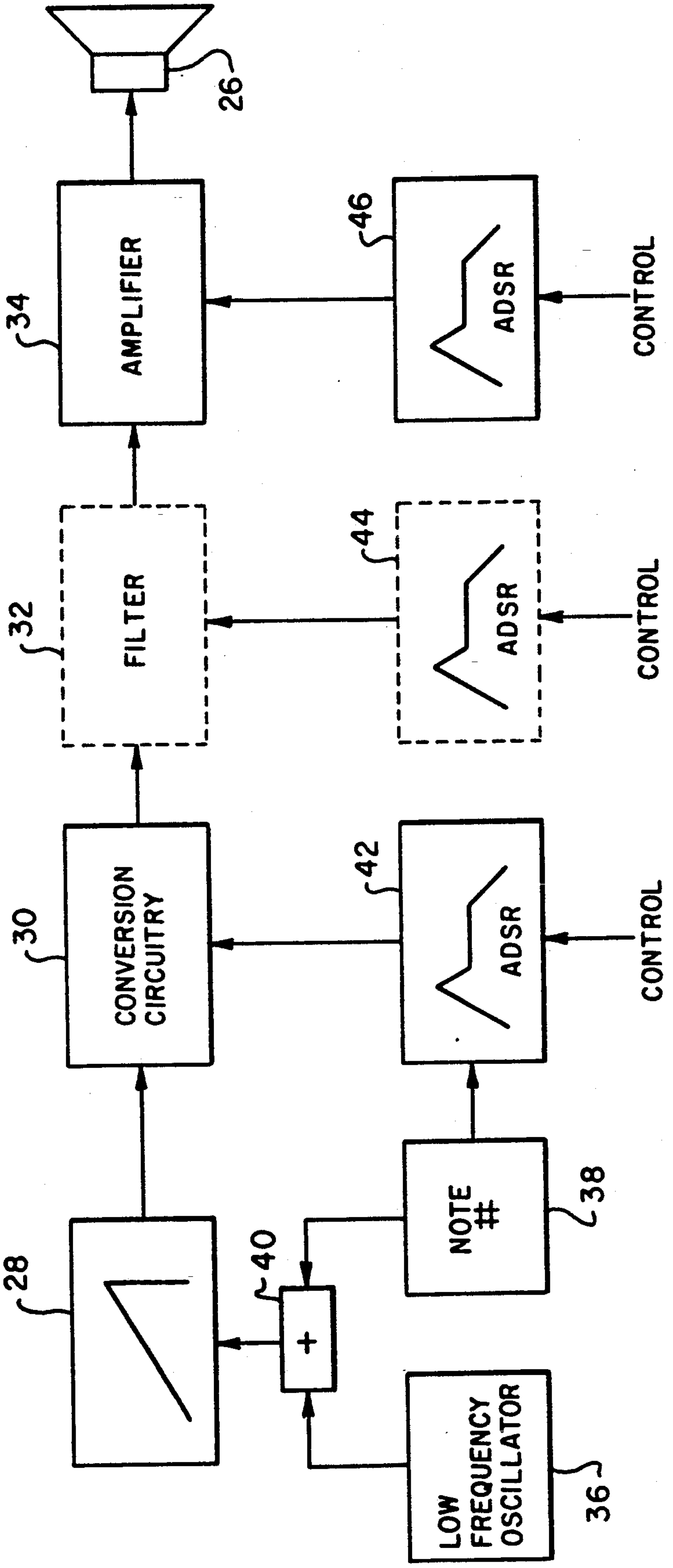
FIG. 2 is a more detailed block diagram of a synthesizer apparatus which may be utilized to implement the method of the present invention.

Referring now to FIG. 2, there is depicted a more detailed block diagram of a synthesizer apparatus which may be utilized to implement the method of the present invention. Of course, those skilled in the art will appreciate that the synthesizer depicted within FIG. 2, while shown as individual block sections, may be implemented utilizing a single special purpose digital signal processor, such as the Texas Instruments TMS320C25, which is contained within the IBM Audio Capture & Playback Adapter (ACPA) card.

As illustrated in FIG. 2, an excitation signal source 28 is depicted. Excitation signal source 28 is preferably a sawtooth wave generator which may be simply and efficiently implemented in a digital circuit by the initiation of a signal and the incrementing of that signal by a constant value while storing the previous value. The output of excitation signal source 28 is then coupled to conversion circuitry 30. Conversion circuitry 30 represents an important feature of the present invention and permits the variable frequency sawtooth waveform output of excitation signal source 28 to be proportionally converted to a triangle waveform in order to minimize the aliasing problem which typically occurs at frequencies at or near the Nyquist rate in digital sample data systems.

Next, the output of conversion circuitry 30 is optionally coupled to a filter 32. Filter 32 is preferably utilized to filter and shape the resultant excitation signal to more closely approximate the sound of a desired musical instrument. Finally, the output of filter 32 is coupled to amplifier 34 and then to speaker 26 to produce synthesized music.

Referring again to excitation signal source 28 it may be seen that this device is controlled by two separate inputs. Note number generator 38 is preferably utilized to control the pitch or fundamental frequency output from excitation signal source 28 in accordance with a so-called "note number" which may be read from a Musical Instrument Digital Interface (MIDI) file or generated by an electronic musical keyboard. A low frequency oscillator 36 is also provided and mixed with the output of note number generator 38 in additive mixer 40 to permit low frequency variations in the pitch of the output signal of excitation signal source s, so that vibrato effects may be accomplished.

Next, it may be seen that conversion circuitry 30 is controlled by an Attack-Decay-Sustain-Release (ADSR) circuit, in a manner which is well known in the synthesizer art. By varying the parameters of each of the four phases of an ADSR waveform voltage controlled amplifiers, filters and similar devices may be effectively controlled. By utilizing an ADSR circuit in conjunction with conversion circuitry 30 a proportional conversion of the output of excitation signal source 28 may be accomplished while also accomplishing signal shaping in a manner which will be described in greater detail herein. It should also be noted that the output of note number generator 38 is coupled to ADSR 42. In this manner, as will be illustrated with regard to FIGS. 3a-3e, the proportional conversion of the output of excitation signal source 28 may be accomplished in response to variations in the frequency of the output of excitation signal source 28.

In a similar manner to that described with regard to conversion circuitry 30, filter 32 and voltage controlled amplifier 34 may also be controlled utilizing an ADSR circuit. By selectively varying the filtration and amplification of the excitation signal, it is possible to simulate the sound of a large number of musical instruments.

With reference now to FIG. 3a-3e, there are depicted waveform illustrations which illustrate the selective reduction of the upper harmonic content of a sawtooth waveform in accordance with the method and apparatus of the present invention. Those skilled in the art will appreciate that this conversion, illustrated in block diagram form at block 30 of FIG. 2, will preferably be accomplished utilizing a digital signal processor which is utilized to implement a MIDI synthesizer in the computer system of FIG. 1.

Figure 3A:
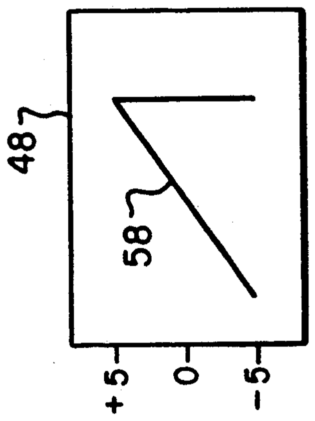
FIG. 3a-3e are waveform illustrations depicting the selective reduction of the upper harmonic content of a sawtooth waveform in accordance with the method and apparatus of the present invention.
Figure 3B:
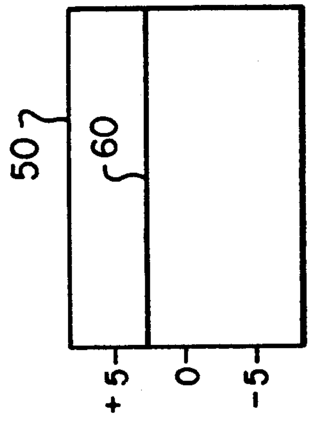

Referring now to FIG. 3*a*, waveform illustration 48 depicts a sawtooth waveform 58 which varies from −5 to +5. This sawtooth waveform is notably rich in harmonic content and is often utilized in digital musical synthesizers for an excitation signal. Next, FIG. 3*b* illustrates a selectable offset 60 within waveform illustration 50. In a preferred embodiment of the present invention selectable offset 60 may vary between Zero and +5; however, a similar result may be obtained by varying selectable offset 60 between zero and −5.

Figure 3C:
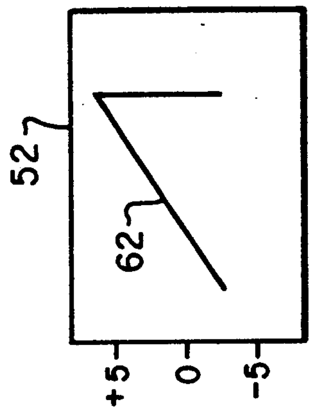

FIG. 3*c* depicts a waveform illustration 52 which includes an offset sawtooth waveform 62. Offset sawtooth waveform 62 is created by summing sawtooth waveform 58 and selectable offset 60. Thus, the resultant waveform depicted within FIG. 3*c* is the exact waveform depicted within FIG. 3*a*, offset by +2 in the illustrated embodiment.

Figure 3D:
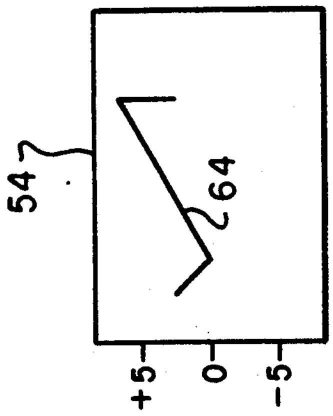

Waveform illustration 54 of FIG. 3*d* depicts offset sawtooth waveform 62 of FIG. 3*c* after it has had its absolute value taken. This is usually a single cycle instruction on a digital signal processor or microprocessor. As those skilled in the art will appreciate, by taking the absolute value of offset sawtooth waveform 62 a triangle waveform, such as waveform 64 within FIG. 3*d* may be generated.

Figure 3E:
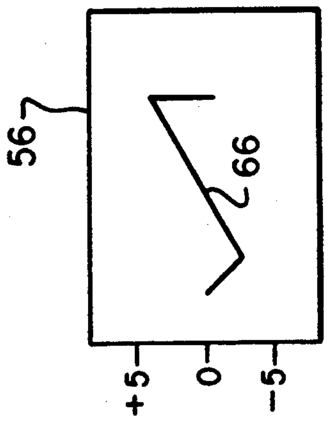

Finally, FIG. 3*e* depicts waveform illustration 56 which includes a triangle waveform 66. Triangle waveform 66 is waveform 64 of FIG. 3*d*, after it has been restored to an approximate zero offset by subtracting a constant of 2.5 (one-half of the peak value of the input waveform level) plus 0.5 times the selectable offset depicted in FIG. 3*b*. As a result, triangle waveform 66, having a zero offset, is created. As those skilled in the art will appreciate, the resultant output waveform will have a substantially reduced upper harmonic content.

An interesting aspect of this conversion technique is the proportional conversion which is available. By raising selectable offset 60 to +5 volts the resultant waveform, after conversion, is a pure sawtooth waveform. Similarly, by setting selectable offset 60 to zero the resultant waveform, after conversion, is a pure triangle waveform. Thus, by varying the level of selectable offset 60, the amount of conversion and thus the amount of upper harmonic content reduction may be simply and efficiently controlled utilizing only three processor cycles for the conversion.

Referring again to FIG. 2, those skilled in the art will then appreciate that by coupling the output of note number generator 38 to conversion circuitry 30 via ADSR 42 it will be possible to automatically vary the upper harmonic content of the excitation signal in direct response to the frequency of that signal. Thus, the need to remove upper harmonic content due to an aliasing problem will automatically control the conversion of the output of excitation signal generator 28. Additionally, by further controlling conversion circuitry 30 utilizing an ADSR circuit it is possible to eliminate the necessity of filter 32 and its associated ADSR circuit 44, further simplifying the processor requirements for a digital musical synthesizer utilizing this technique.

While the invention has been particularly shown and described with reference to a preferred embodiment, it will be understood by those skilled in the art that various changes in form and detail may be made therein without departing from the spirit and scope of the invention.

We claim:

1. A conversion circuit for selectively reducing the upper harmonic content of a variable frequency sawtooth waveform, said conversion circuit comprising:

offset generation means for generating a variable selectable offset in response to said frequency of said variable frequency sawtooth waveform;

summation means for summing said variable selectable offset and a sawtooth waveform to create a resultant waveform;

absolute value conversion means for taking the absolute value of said resultant waveform to create a converted resultant waveform; and offset restoration means for restoring said converted resultant waveform to a zero offset waveform having less upper harmonic content than said sawtooth waveform.

2. The conversion circuit according to claim 1, wherein said offset generation means comprises an Attack-Decay-Sustain-Release circuit.

3. The conversion circuit according to claim 1, wherein said selectable offset comprises zero and wherein said restored zero offset waveform comprises a triangle waveform.

4. A digital musical synthesizer circuit comprising:

a variable frequency sawtooth waveform generator having an output;

a proportional conversion circuit coupled to said output of said variable frequency sawtooth waveform generator for selectively converting said variable frequency sawtooth waveform to a variable frequency triangle waveform in response to the frequency of said output; and audio output means coupled to said proportional conversion circuit for generating audible synthesized music.

5. The digital musical synthesizer circuit according to claim 4, further including filter means coupled between said proportional conversion circuit and said audio output means for filtering and shaping said audible synthesized music.

6. The digital musical synthesizer circuit according to claim 5, further including amplifier means coupled between said proportional conversion circuit and said audio output means for amplifying said audible synthesized music.

7. The digital musical synthesizer circuit according to claim 6, further including offset restoration means for restoring said converted resultant waveform to a zero offset.

8. The digital musical synthesizer circuit according to claim 5, wherein said audio output means comprises an audio speaker.

9. The digital musical synthesizer circuit according to claim 5, wherein said proportional conversion circuit includes a summation circuit for adding a selectable offset to said variable frequency sawtooth waveform to create a resultant waveform.

10. The digital musical synthesizer circuit according to claim 9, wherein said selectable offset is determined in response to the frequency of said output.

11. The digital musical synthesizer circuit according to claim 10, wherein said proportional conversion circuit further includes absolute conversion means for taking the absolute value of said resultant waveform to create a converted resultant waveform.

12. A method for selectively reducing the upper harmonic content of a variable frequency sawtooth waveform, said method comprising the steps of:

generating a variable selectable offset in response to said frequency of said variable frequency sawtooth waveform;

summing said variable selectable offset and a sawtooth waveform to create a resultant waveform;

taking the absolute value of said resultant waveform; and restoring said absolute value of said resultant waveform to a zero offset waveform having less upper harmonic content than said sawtooth waveform.

* * * * *